(12) United States Patent
Wang (10) Patent No.: US 10,109,250 B2
(45) Date of Patent: Oct. 23, 2018

(54) SHIFT REGISTER AND DRIVING METHOD THEREOF, GATE DRIVING CIRCUIT AND DISPLAY APPARATUS

(71) Applicants:BOE TECHNOLOGY GROUP CO., LTD., Beijing (CN); ORDOS YUANSHENG OPTOELECTRONICS CO., LTD., Ordos, Inner Mongolia (CN)

(72) Inventor: Jiguo Wang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 197 days.

(21) Appl. No.: 15/145,269

(22) Filed: May 3, 2016

(65) Prior Publication Data

US 2017/0061922 A1    Mar. 2, 2017

(30) Foreign Application Priority Data

Aug. 26, 2015    (CN) .......................... 2015 1 0532565

(51) Int. Cl.
| | |
|---|---|
| *G11C 19/00* | (2006.01) |
| *G09G 3/36* | (2006.01) |
| *G11C 19/18* | (2006.01) |
| *G11C 19/28* | (2006.01) |

(52) U.S. Cl.
CPC ......... *G09G 3/3677* (2013.01); *G11C 19/184* (2013.01); *G11C 19/188* (2013.01); *G09G 2300/0408* (2013.01); *G09G 2310/0286* (2013.01); *G09G 2310/08* (2013.01); *G11C 19/28* (2013.01)

(58) Field of Classification Search
None
See application file for complete search history.

(56) References Cited

U.S. PATENT DOCUMENTS

| | | | |
|---|---|---|---|
| 9,373,414 B2* | 6/2016 | Shang | G11C 19/28 |
| 9,747,854 B2* | 8/2017 | Li | G09G 3/3655 |
| 2011/0057926 A1* | 3/2011 | Shang | G09G 3/3677 |
| | | | 345/213 |

(Continued)

FOREIGN PATENT DOCUMENTS

| | | | |
|---|---|---|---|
| CN | 104217693 | * | 12/2014 |
| CN | 104778928 | * | 7/2015 |

*Primary Examiner* — Tuan T Lam
(74) *Attorney, Agent, or Firm* — Ladas & Parry LLP (57) ABSTRACT

There are presented a shift register and a driving method thereof, a gate driving circuit and a display apparatus. The shift register includes a first feedback module and a pull-down module, wherein the first feedback module comprises at least two feedback units, control terminals of respective feedback units are connected to different control points respectively, each feedback unit has an input terminal connected to a first level input terminal and an output terminal connected to a first node, the first node is connected to a control terminal of the pull-down module, and the pull-down module has an input terminal connected to the first level input terminal and an output terminal connected to a signal output terminal of the shift register. The shift register is used to enhance noise resistance capability of the shift register.

20 Claims, 2 Drawing Sheets

(56) References Cited

U.S. PATENT DOCUMENTS

| | | | |
|---|---|---|---|
| 2012/0262438 A1* | 10/2012 | Shang | G11C 19/28 345/211 |
| 2014/0056399 A1* | 2/2014 | Shang | G11C 19/28 377/68 |
| 2014/0192039 A1* | 7/2014 | Wang | G11C 19/28 345/213 |
| 2016/0293092 A1* | 10/2016 | Li | G09G 3/20 |
| 2017/0018243 A1* | 1/2017 | Huang | G09G 3/36 |
| 2017/0032752 A1* | 2/2017 | Huang | G09G 3/3648 |
| 2017/0039971 A1* | 2/2017 | Huang | G09G 3/3677 |
| 2017/0092172 A1* | 3/2017 | Wang | G09G 3/20 |
| 2017/0092212 A1* | 3/2017 | Wang | G09G 3/20 |
| 2017/0256220 A1* | 9/2017 | Huang | G09G 3/3677 |
| 2017/0278473 A1* | 9/2017 | Shang | G09G 3/3674 |

* cited by examiner

Fig.3

SHIFT REGISTER AND DRIVING METHOD THEREOF, GATE DRIVING CIRCUIT AND DISPLAY APPARATUS The present application claims the priority of a Chinese patent application No. 201510532565.9 filed on Aug. 26, 2015. Herein, the content disclosed by the Chinese patent application is incorporated in full by reference as a part of the present disclosure.

TECHNICAL FIELD

The present disclosure relates to a shift register and a driving method thereof, a gate driving circuit, and a display apparatus.

BACKGROUND

At present, a display apparatus generally includes an array substrate and a gate driving circuit, wherein the gate driving circuit is bound on a surrounding area of the array substrate through a flexible circuit board. In particular, the gate driving circuit comprises multiple stages of shift registers connected in cascades mutually, wherein an input terminal of a current stage of shift register is connected to an output terminal of a previous stage of shift register, a reset controlling terminal of the current stage of shift register is connected to an output terminal of a next stage of shift register, and an output terminal of the current stage of shift register is connected to a gate line on the array substrate; respective gate lines are controlled to be turned on through respective stages of shift registers, thereby the progressive scan driving is realized to display images.

In order to simplify manufacturing process of the display apparatus and reduce cost of the display apparatus, there is provided a Gate Driver on Array (GOA) technique that integrates the gate driving circuit on the array substrate directly. In the GOA technique, the gate driving circuit is formed on the surrounding area of the array substrate directly, and respective electronic elements and wirings comprised in the shift resister of the gate driving circuit are all formed through existing films on the array substrate, thereby being capable of simplifying manufacturing process of the display apparatus effectively and reducing the cost of the display apparatus.

However, inventor(s) of the present application finds (find) that the circuit structure of the shift register in the gate driving circuit which is formed by applying the GOA technique is not reasonable and it has the problem of poor noise resistance capacity.

SUMMARY

There is provided in the present disclosure a shift register and a driving method of the same, a gate driving circuit, and a display apparatus, which are used to enhance noise resistance capacity of the shift register.

According to one aspect of the present disclosure, there is provided a shift register, comprising a first feedback module and a pull-down module; wherein the first feedback module comprises at least two feedback units, control terminals of respective feedback units are connected to different control points, each feedback unit has an input terminal connected to a first level input terminal, and an output terminal is connected to a first node, the first node is connected to a control terminal of the pull-down module, of the pull-down module has an input terminal connected to the first level input terminal, and an output terminal connected to a signal output terminal of the shift register.

In the shift register provided in the present disclosure, the first feedback module comprises at least two feedback units, the control terminals of respective feedback units are connected to different control points respectively, and the input terminal of each feedback unit is connected to the first level input terminal, the output terminal thereof is connected to the control terminal of the pull-down module, and each feedback unit can control connection between the control terminal of the pull-down module and the first level input terminal separately. Therefore, even if one of the feedback units cannot operate normally, for example, when a level of a control point connected to the control terminal of the feedback unit is instable, or, when the feedback unit is damaged, there is still at least one feedback unit that can control connection between the control terminal of the pull-down module and the first level input terminal, so that connection of the signal output terminal of the shift register with the first level input terminal is controlled. Therefore, the shift register in the present disclosure has strong noise resistance capability.

There is further provided in the present disclosure a gate driving circuit, comprising the shift registers described above, wherein all of the shift registers are connected in cascades mutually.

Since the gate driving circuit provided in the present disclosure comprises the shift register described above, the gate driving circuit has beneficial effects the same as the shift register, and thus no further description is given herein.

There is further provided a display apparatus, comprising the gate driving circuit described above.

Since the display apparatus provided in the present disclosure comprises the gate driving circuit described above, the display apparatus has beneficial effects the same as the gate driving circuit, and thus no further description is given herein.

There is further provided in the present disclosure a driving method of a shift register used to drive the shift register, comprising:

controlling different feedback units comprised in the first feedback module through different control points so as to control a potential of the first node, controlling the pull-down module through the first node, and controlling connection of the first level input terminal with the signal output terminal.

In the driving method of the shift register provided in the present disclosure, since different feedback units comprised in the first feedback module are controlled through different control points, and each feedback unit has the input terminal connected to the first level input terminal and the output terminal is connected to the control terminal of the pull-down module, which can control connection between the control terminal of the pull-down module and the first level input terminal separately, even if one of the feedback units cannot operate normally, for example, when a level of a control point connected to the control terminal of the feedback unit is instable, or, when the feedback unit is damaged, there is still at least one feedback unit that can control the connection between the control terminal of the pull-down module and the first level input terminal, so that connection of the signal output terminal of the shift register with the first level input terminal is controlled. Therefore, the shift register in the present disclosure has strong noise resistance capability.

DETAILED DESCRIPTION

Inventor(s) of the present application finds (find) that a feedback module in the existing shift register comprises only one transistor. As a result, when this transistor fails to operate normally, for example, when a level of a control point connected to a control terminal of the transistor is instable, or, when the transistor is damaged, the shift register does not have noise resistance capability.

Given that, inventor(s) of the present application provides (provide) an improved technical solution. At least two feedback units are disposed in the first feedback module, control terminals of respective feedback units are connected to different control points, and each feedback unit has an input terminal connected to a first level input terminal and an output terminal connected to a control terminal of a pull-down module, and each feedback unit can control individually the connection between a control terminal of the pull-down module and the first level input terminal, so as to raise noise resistance capability of the shift register.

In order to facilitate understanding, the shift registers of the present disclosure will be described in detail below in connection with figures of the specification.

Figure 1:
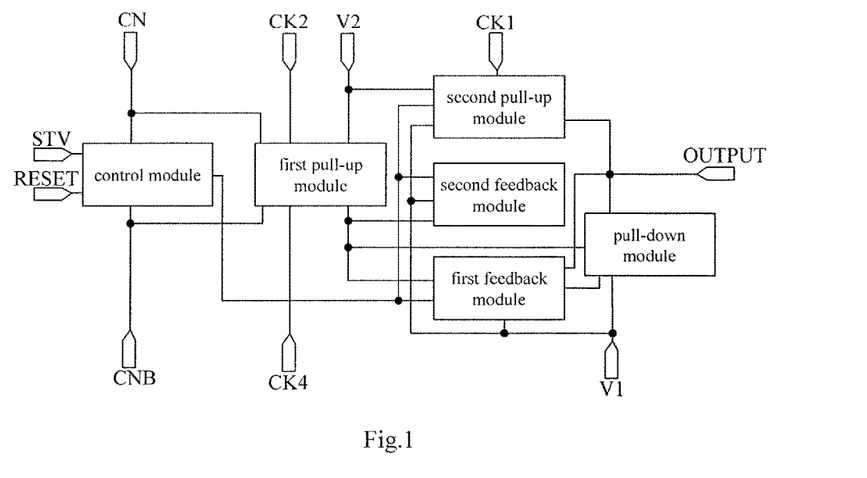
FIG. 1 is a schematic diagram of modules of a shift register in an embodiment of the present disclosure.
Figure 2:
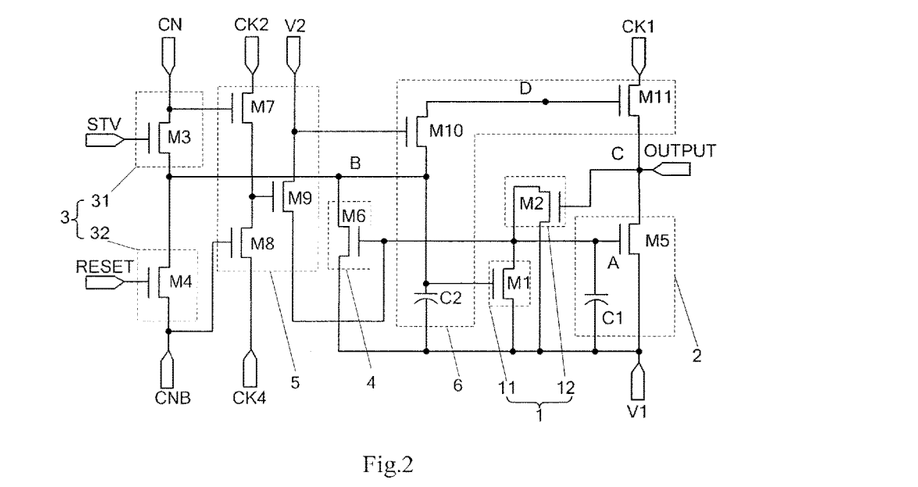
FIG. 2 is a schematic diagram of a circuit of a shift register in an embodiment of the present disclosure.

There is provided in an embodiment of the present disclosure a shift register. As shown in FIGS. 1 and 2, the shift register comprises a first feedback module 1 and a pull-down module 2; wherein the first feedback module 1 comprises at least two feedback units, control terminals of respective feedback units are connected to different control points, each feedback unit has an input terminal connected to a first level input terminal V1 and an output terminal connected to a first node A, and the first node A is connected to a control terminal of the pull-down module 2. It can be known from the above description that the first node A is a node between the output terminal of each feedback unit and the control terminal of the pull-down module 2. The pull-down module 2 has an input terminal connected to the first level input terminal V1 and an output terminal is connected to a signal output terminal OUTPUT of the shift register. Herein, a first level signal outputted by the first level input terminal V1 has a phase opposite to a shift signal outputted by the signal output terminal OUTPUT, that is, when the shift signal is at a high level, the first level signal is at a low level; when the shift signal is at a low level, the first level signal is at a high level.

Because the first feedback module comprises at least two feedback units, the control terminals of respective feedback units are connected to different control points respectively, and each feedback unit has the input terminal connected to the first level input terminal and the output terminal connected to the control terminal of the pull-down module, and each feedback unit can control separately the connection between the control terminal of the pull-down module and the first level input terminal. For the above reason, even if one of the feedback units cannot operate normally, for example, when a level of a control point connected to the control terminal of the feedback unit is instable, or, when the feedback unit is damaged, there is still at least one feedback unit that can control the connection between the control terminal of the pull-down module and the first level input terminal, so that the connection between the signal output terminal of the shift register and the first level input terminal is controlled. Therefore, the shift register in the present disclosure has strong noise resistance capability.

As shown in FIGS. 1 and 2, the shift register further comprises a control module 3, the first feedback module 1 comprises two feedback units, which are a first feedback unit 11 and a second feedback unit 12, different control points are a second node B and a third node C, the control module 3 has an output terminal connected to the second node B and configured to control a level of the second node B, and a control terminal of the first feedback unit 11 is connected to the second node B. It can be known from the above description that the second node B is a node between the output terminal of the control module 3 and the control terminal of the first feedback unit 11, the first feedback unit 11 has an output terminal connected to the control terminal of the pull-down module 2 and an input terminal connected to the first level input terminal V1, so that the connection between the output terminal and input terminal of the first feedback unit 11 can be controlled by the control module 3, and thus the connection of the control terminal of the pull-down module 2 with the first level input terminal V1 can be controlled, so as to control the connection of the signal output terminal OUTPUT with the first level input terminal V1. A control terminal of the second feedback unit 12 is connected to the third node C which is connected to the signal output terminal OUTPUT. It can be known from the above description that the third node C is a node between the signal output terminal OUTPUT and the control terminal of the second feedback unit 12, so that the connection of an output terminal and an input terminal of the second feedback unit 12 can be controlled through the signal output terminal OUTPUT. It can be known from the above description that the second feedback unit 12 has the output terminal connected to the control terminal of the pull-down module 2 and the input terminal connected to the first level input terminal V1, so that the connection of the control terminal of the pull-down module 2 with the first level input terminal V1 can be controlled, and thus the connection of the signal output terminal OUTPUT and the first level input terminal V1 can be controlled.

Specifically, the first feedback unit 11 comprises a first transistor M1, whose control terminal is connected to the second node B, first terminal is connected to the first level input terminal V1, and second terminal is connected to the first node A, so that turning-on or turning-off of the first transistor M1 can be controlled by the second node B, and thus the connection of the first level input terminal V1 with the first node A is controlled, so as to control the connection between the control terminal of the pull-down module 2 and the first level input terminal V1; the second feedback unit 12 comprises a second transistor M2, whose control terminal is connected to the third node C, first terminal is connected to the first level input terminal V1, and second terminal is connected to the first node A, so that turning-on or turning-off of the second transistor M2 can be controlled by the third node C, and thus the connection of the first node A with the first level input terminal V1 is controlled, so as to control the connection of the control terminal of the pull-down module 2 with the first level input terminal V1.

Further, the control module 3 comprises a first control unit 31 and a second control unit 32. The first control unit 31 has a control terminal connected to a start signal input terminal STV, an input terminal connected to a first direct current signal input terminal CN, and an output terminal connected to the second node B. It can be known from the above description that the control terminal of the first feedback unit 11 is connected to the second node B. Therefore, the first control unit 31 can control the connection of the control terminal of the first feedback unit 11 with the first direct current signal CN. The second control unit 32 has a control terminal connected to a reset signal input terminal RESET, an input terminal connected to a second direct current signal input terminal CNB, and an output terminal connected to the second node B. It can be known from the above description that the control terminal of the first feedback unit 11 is connected to the second node B. Therefore, the second control unit 32 can then control the connection of the control terminal of the first feedback unit 11 with the second direct current signal input terminal CNB. Herein, except for a first stage of shift register, start signal input terminals of all stages of shift registers are connected to signal output terminal of previous stages of shift registers; and except for a last stage of shift register, reset signal terminals of all stages of shift registers are connected to signal output terminals of next stages of shift registers.

Specifically, the first control unit 31 comprises a third transistor M3, and the second control unit 32 comprises a fourth transistor M4. The third transistor M3 has a control terminal connected to the start signal input terminal STV, a first terminal connected to the first direct current signal input terminal CN, and a second terminal connected to the second node B, so that turning-on or turning-off of the third transistor M3 can be controlled through the start signal input terminal STV, and thus the connection of the second node B with the first direct current signal input terminal CN can be controlled, so as to control the connection between the control terminal of the first transistor M1 and the first direct current signal input terminal CN; the fourth transistor M4 has a control terminal connected to the reset signal input terminal RESET, a first terminal connected to the second direct current signal input terminal CNB, and a second terminal connected to the second node B, so that turning-on or turning-off of the fourth transistor M4 can be controlled through the reset signal input terminal RESET, and thus the connection of the second direct current signal input terminal CNB with the second node B is controlled, so as to control the connection of the control terminal of the first transistor M1 with the second direct current signal input terminal CNB.

In addition, the pull-down module 2 comprises a fifth transistor M5 and a first capacitor C1. The fifth transistor M5 has a control terminal connected to the first node A, a first terminal connected to the first level input terminal V1, and a second terminal connected to the signal output terminal OUTPUT, so that turning-on or turning-off of the fifth transistor M5 can be controlled by the first node A, so as to control the connection between the signal output terminal OUTPUT and the first level input terminal V1. Two electrode plates of the first capacitor C1 are connected to the first node A and the first level input terminal V1 respectively, so that the level of the first node A can be controlled by discharging the first capacitor C1.

In addition, the shift register further comprises a second feedback module 4, whose control terminal is connected to the first node A, input terminal is connected to the first level input terminal V1, and output terminal is connected to the second node B. The second node B is connected to the control terminal of the first feedback unit 11, so that the second feedback module 4 can control the connection of the control terminal of the first feedback unit 11 with the first level input terminal V1.

Specifically, the second feedback module 4 comprises a sixth transistor M6, whose control terminal is connected to the first node A, first terminal is connected to the first level input terminal V1, and second terminal is connected to the second node B, so that turning-on or turning-off of the sixth transistor M6 can be controlled by the first node A, so as to control the connection of the second node B with the first level input terminal V1.

In addition, the shift register further comprises a first pull-up module 5. The first pull-up module 5 has an output terminal connected to the first node A and is configured to control the connection of the second level signal input terminal V2 with the first node A. Since the first node A is connected to the control terminal of the second feedback module 4 and the control terminal of the pull-down module 2 simultaneously, the first pull-up module 5 can control the connection between the control terminal of the second feedback module 4 and the second level input terminal V2 as well as the connection between the control terminal of the pull-down module 2 and the second level input terminal V2 simultaneously. Herein, the second level signal outputted by the second level input terminal V2 has a phase opposite to the first level signal outputted by the first level input terminal V1, that is, when the first level signal is at a high level, the second level signal is at a low level; when the first level signal is at a low level, the second level signal is at a high level.

Specifically, the first pull-up module 5 comprises a seventh transistor M7, an eighth transistor M8 and a ninth transistor M9. The seventh transistor M7 has a control terminal connected to the first direct current signal input terminal CN, a first terminal connected to a second clock signal input terminal CK2, and a second terminal connected to a control terminal of the ninth transistor M9, so that turning-on or turning-off of the seventh transistor M7 can be controlled by the first direct current signal input terminal CN, so as to control the connection of the control terminal of the ninth transistor M9 with the second clock signal input terminal CK2. The eighth transistor M8 has a control terminal connected to the second direct current signal input terminal CNB, a first terminal connected to a fourth clock signal input terminal CK4, and a second terminal connected to the control terminal of the ninth transistor M9, so that turning-on or turning-off of the eighth transistor M8 can be controlled by the second direct current signal input terminal CNB, so as to control the connection of the control terminal of the ninth transistor M9 with the fourth clock signal input terminal CK4. The ninth transistor M9 has a first terminal connected to the first node A, and a second terminal connected to the second level signal input terminal V2, so that the connection between the first node A and the second level signal input terminal V2 is control led.

In addition, the shift register further comprises a second pull-up module 6. The second pull-up module 6 has an output terminal is connected to the signal output terminal OUTPUT and is configured to control the connection of the first clock signal input terminal CK1 with the signal output terminal OUTPUT. Specifically, the second pull-up module 6 comprises a tenth transistor M10, an eleventh transistor M11 and a second capacitor C2. The tenth transistor M10 has a control terminal connected to the second level input terminal V2, a first terminal connected to the second node B, and a second terminal connected to a control terminal of the eleventh transistor M11, so that turning-on or turning-off of the tenth transistor M10 can be controlled by the second level input terminal V2, so as to control the connection of the control terminal of the eleventh transistor M11 with the second node B. The eleventh transistor M11 has a first terminal connected to the first clock signal input terminal CK1, a second terminal connected to the signal output terminal OUTPUT, so that turning-on or turning-off of the eleventh transistor M11 can be controlled by the second node B, so as to control the connection of the first clock signal input terminal CK1 with the signal output terminal OUTPUT. Two electrode plates of the second capacitor C2 are connected to the second node B and the first level input terminal V1 respectively, so that the level of the second node B can be controlled by discharging the second capacitor C2. A product of length and width of a channel of the eleventh transistor M11 is at least two times of that of the tenth transistor M10. Herein, the control terminal of the eleventh transistor M11 is a fourth node D.

The reason for defining that the product of the length and width of the channel of the eleventh transistor M11 is at least two times of that of the tenth transistor M10 is as follows: by taking a control terminal of a transistor being a gate, a first terminal thereof being a source and a second terminal thereof being a drain as an example, a magnitude of a parasitic capacitance between the gate and the source of the transistor and between the gate and the drain of the transistor is: $(WLC_{ox}/2)+WC_{ov}$, where W represents the width of the channel of the transistor, $C_{ov}$ represents an overlapping capacitance of a unit width of the channel of the transistor, L represents the length of the channel of the transistor, and $C_{ox}$ represents an capacitance of a unit length of the channel of the transistor. Therefore, the magnitude of the parasitic capacitance of the transistor is directly proportional to the product of the length and width of the channel of the transistor. Since the product of the length and width of the channel of the eleventh transistor M11 is at least two times of that of the tenth transistor M10, there is a larger parasitic capacitance between the gate and the source of the eleventh transistor M11 and between the gate and the drain of the eleventh transistor M11. Thus, when levels of the source and drain of the eleventh transistor M11 change, bootstrapping effect would occur to the eleventh transistor M11, such that a certain level difference is maintained between the level of the fourth node D (i.e., the node connected to the gate of the eleventh transistor M11) and the level outputted by the signal output terminal OUTPUT.

It needs to note that the level signal outputted by the first direct current signal input terminal CN has a phase opposite to the level signal outputted by the second direct current signal input terminal CNB, that is, when the level signal outputted by the first direct current signal input terminal CN is at the high level, the level signal outputted by the second direct current signal input terminal CNB is at the low level; when the level signal outputted by the second direct current input terminal CNB is at the low level, the level signal outputted by the first direct current signal input terminal CN is at the high level. The level signal outputted by the first clock signal input terminal CK1, the level signal outputted by the second clock signal input terminal CK2, the level signal outputted by the third clock signal input terminal CK3 and the level signal outputted by the fourth clock signal input terminal CK4 are clock signals having a phase difference of ¼ cycle.

In addition, there is further provided in an embodiment of the present disclosure a gate driving circuit, comprising the shift registers described above, all of which are connected in cascades mutually, wherein except for the first stage of shift register, a signal input terminal of each stage of shift register is connected to a signal output terminal of the previous stage of shift register; except for the last stage of shift register, a reset signal control terminal of each stage of shift register is connected to a signal output terminal of the next stage of shift register; and a signal output terminal of each stage of shift register is connected to a gate line on the array substrate. The gate driving circuit in the embodiments of the present disclosure is capable of realizing forward scanning and backward scanning. Since the gate driving circuit provided in the embodiments of the present disclosure comprises the shift register described above, the gate driving circuit has the same beneficial effects as the shift registers, and thus no further description is given herein.

In addition, there is further provided in an embodiment of the present disclosure a display apparatus, comprising the gate driving circuit described above. This display apparatus can be any product or elements having the function of displaying such as a liquid crystal panel, an electronic paper, a mobile phone, a tablet computer, a television set, a display, a notebook computer, a digital photo frame, and a navigator and so on. Since the display apparatus provided in the embodiment of the present disclosure comprises the gate driving circuit described above, the display apparatus has the same beneficial effects as the gate driving circuit, and thus no further description is given herein.

There is provided in an embodiment of the present disclosure a driving method of a shift register, which is used to drive the shift register, comprising:

controlling different feedback units comprised in a first feedback module through different control points, so as to control a potential of a first node, and controlling the pull-down module through the first node to control the connection of the first level input terminal with the signal output terminal.

Since different feedback units comprised in the first feedback module are controlled through different control points, and each feedback unit has the input terminal connected to the first level input terminal, the output terminal connected to the control terminal of the pull-down module, and each feedback unit can control the connection between the control terminal of the pull-down module and the first level input terminal separately, even if one of the feedback units cannot operate normally, for example, the level of the control point connected to the control terminal of the feedback unit is instable, or, the feedback unit is damaged, there is at least one feedback unit that can control the connection between the control terminal of the pull-down module and the first level input terminal, so that the connection of the signal output terminal of the shift register with the first level input terminal is controlled. Therefore, the shift register in the present disclosure has strong noise resistance capability.

Further, as shown in FIGS. 1 and 2, when the shift register further comprises the control module 3, the first feedback module 1 comprises two feedback units, which are the first feedback unit 11 and the second feedback unit 12, and the respective modules and units therebetween have the connecting relationship as shown in FIGS. 1 and 2, the step of controlling different feedback units through different control points comprises specifically:

the different control points being the second node B and the third node C;

controlling the second node B through the output terminal of the control module 3, and controlling the first feedback unit 11 through the second node B, so as to control the connection of the first level input terminal V1 with the signal output terminal OUTPUT; and controlling the third node C through the signal output terminal OUTPUT, and controlling the second feedback unit 12 through the third node C, so that the connection of the first level input terminal V1 with the first node A is controlled, and thus the connection of the first level input terminal V1 with the signal output terminal OUTPUT is controlled.

Figure 3:
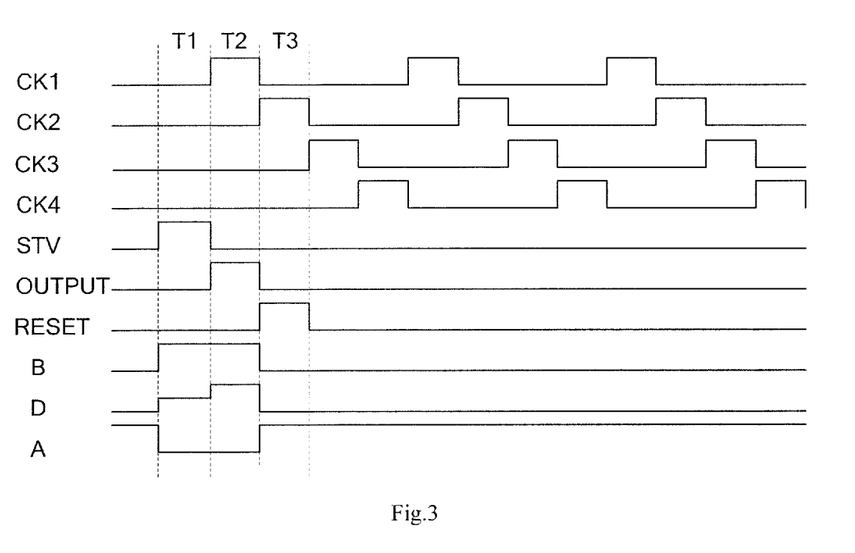
FIG. 3 is an operation timing diagram of a shift register in an embodiment of the present disclosure.

A most specific driving method of the shift register in the embodiments of the present disclosure will be described by combining with the circuit schematic diagram of the shift register in the embodiment of the present disclosure as shown in FIG. 2 and the operation timing diagram of the shift register in the embodiment of the present disclosure. It needs to note that the embodiments of the present disclosure are described by taking all of the transistors being N-type transistors as an example. When the level of the control terminal of the N-type transistor is at the high level, the transistor is turned on; when the level of the control terminal of the N-type transistor is at the low level, the transistor is turned off. Herein, the first level input terminal V1 outputs a low level signal, the second level input terminal V2 outputs a high level signal, the first direct current signal input terminal CN outputs the high level signal, and the second direct current signal input terminal CNB outputs the low level signal. The shift signal outputted by the signal output terminal OUTPUT of the shift register is the high level signal.

First phase T1: the first clock signal input terminal CK1 inputs the low level signal, the second clock signal output terminal CK2 inputs the low level signal, the fourth clock signal input terminal CK4 inputs the low level signal, the start signal input terminal STV inputs the high level signal, and the reset signal input terminal RESET inputs the low level signal. Since the reset signal input terminal RESET inputs the low level signal, the fourth transistor M4 is turned off. Since the start signal input terminal STV inputs the high level signal, the third transistor M3 is turned on, and the high level signal outputted by the first direct current signal input terminal CN makes the level of the second node B become the high level to charge the second capacitor C2, and at the same time, the first transistor M1 is turned on. The low level signal inputted by the first level input terminal V1 makes the level signal of the first node A become the low level, so that the fifth transistor M5 is turned off. At the same time, since the second level input terminal V2 inputs the high level signal, the tenth transistor M10 is turned on. The high level of the second node B is transmitted to the fourth node D, so that the level of the fourth node D becomes the high level, thereby making the eleventh transistor M11 turned on. The low level signal inputted by the first clock signal input terminal CK1 is transmitted to the signal output terminal OUTPUT, so that the signal output terminal OUTPUT outputs the low level signal.

Second phase T2: the first clock signal input terminal CK1 inputs the high level signal, the second clock signal input terminal CK2 inputs the low level signal, the fourth clock signal input terminal CK4 inputs the low level signal, the start signal input terminal STV inputs the low level signal, and the reset signal input terminal RESET inputs the low level signal. Since the start signal input terminal STV inputs the low level signal, the third transistor M3 is turned off. Since the reset signal input terminal RESET inputs the low level signal, the fourth transistor M4 is turned off. At this time, the second capacitor C2 is discharged, so that the second node B is maintained at the high level, and thus the first transistor M1 is turned on continuously. The low level signal inputted by the first level input terminal V1 is continuously transmitted to the first node A, so that the first node A is maintained at the low level, and thus the fifth transistor M5 is maintained turned off. At the same time, since the second level input terminal V2 inputs the high level signal, the tenth transistor M10 is maintained turned on. The high level of the second node B is transmitted to the fourth node D, so that the fourth node D is maintained at the high level, and thus the eleventh transistor M11 is maintained turned on. The high level signal inputted by the first clock signal input terminal CK1 is transmitted to the signal output terminal OUTPUT, so that the signal output terminal OUTPUT outputs the high level signal.

At this time, since the eleventh transistor M11 has larger parasitic capacitance, the bootstrapping effect occurs to the eleventh transistor M11 per se after the output signal of the signal output terminal OUTPUT changes from the low level signal to the high level signal, so that the level signal of the fourth node D1 is raised further, and the level of one terminal of the tenth transistor M10 is higher than the level of the control terminal of the tenth transistor, thereby the tenth transistor M10 is turned off, which effectively makes the fourth node D maintain at the high level, and thus makes the eleventh transistor M11 maintain turned on.

Because the second node B and the third node C are both at the high level in the second phase T2, the first transistor M1 and the second transistor M2 are both turned on, and thus the low level signal inputted by the first level input terminal V1 can be transmitted to the first node A through the first transistor M1 and the second transistor M2 respectively, thereby making the first node A maintain at the low level, and further making the fifth transistor M5 turned off, which ensures the signal output terminal OUTPUT to output the high level signal stably.

Third phase T3: the first clock signal input terminal CK1 inputs the low level signal, the second clock signal input terminal CK2 inputs the high level signal, the fourth clock signal input terminal CK4 inputs the low level signal, the starts signal input terminal STV inputs the low level signal, and the reset signal input terminal RESET inputs the high level signal. In the third phase T3, within a very short time after the signal inputted by the first clock signal input terminal CK1 changes from the high level signal into the low level signal, the low level signal inputted by the first clock signal input terminal CK1 is transmitted to the signal output terminal OUTPUT, so that the signal output terminal OUTPUT outputs the low level signal. Due to the bootstrapping effect of the eleventh transistor M11, the level of the fourth node D is reduced, such that the level of the two terminals of the tenth transistor M10 is made lower than the high level of the control terminal, and thus the tenth transistor M10 is turned on again.

Since the start signal input terminal STV inputs the low level signal, the third transistor M3 is turned off. Since the reset signal input terminal RESET inputs the high level signal, the fourth transistor M4 is turned on. Thus, the low level signal inputted by the second direct current signal input terminal CNB is transmitted to the second node B, such that the level of the second node B changes into the low level. Since the tenth transistor M10 is turned on, the low level of the second node B is transmitted to the fourth node D, and the level of the fourth node D changes into the low level, thereby making the eleventh transistor M11 is turned off. Since the first direct current input terminal CN inputs the high level signal, the seventh transistor M7 is turned on, and thus the high level signal inputted by the second clock signal input terminal CK2 is transmitted to the control terminal of the ninth transistor M9, such that the ninth transistor M9 is turned on, and thus the high level signal inputted by the second level input terminal V2 is transmitted to the first node A, thereby making the level of the first node A change into the high level. At the same time, the first capacitor C1 is charged. Since the first node A is at the high level, the fifth transistor M5 is turned on, and thus the low level signal inputted by the first level input terminal V1 is transmitted to the signal output terminal OUTPUT, thereby the signal output terminal OUTPUT outputs the low level signal.

If all of transistors in the embodiments of the present disclosure are P-type transistors, then the transistors are turned off when the control terminal of the P-type transistor is at the high level; the transistors are turned on when the control terminal of the P-type transistor is at the low level. When all of transistors in the embodiments of the present disclosure are P-type transistors, it is easy for those skilled in the art to think of the corresponding driving method of the shift register, and thus no further description is given herein.

The above descriptions are just specific implementations of the present disclosure, but the protection scope of the present disclosure is not limited thereto. Any alternation or replacement that can be easily conceived by those skilled in the art being familiar with the technical field within the technical scope of the present disclosure shall be covered within the protection scope of the present disclosure. Therefore, the protection scope of the present disclosure shall be subjected to the protection scope of the claims.

What is claimed is:
1. A shift register, comprising:
a first feedback module;
a pull-down module; and
a first pull-up module,
wherein:
the first feedback module comprises at least two feedback units,
control terminals of respective feedback units are connected to different control points respectively,
each feedback unit has an input terminal connected to a first level input terminal and an output terminal connected to a first node,
the first node is connected to a control terminal of the pull-down module,
the pull-down module has an input terminal connected to the first level input terminal and an output terminal connected to a signal output terminal of the shift register, and
the first pull-up module has an output terminal connected to the first node and is configured to control connection of a second level signal input terminal with the first node in accordance with a first direct current signal input terminal and a second direct current signal input terminal.

2. The shift register according to claim 1, wherein the shift register further comprises a control module, the first feedback module comprises two feedback units, which are a first feedback unit and a second feedback unit, the different control points are a second node and a third node, the control module has an output terminal connected to the second node and is configured to control a level of the second node, a control terminal of the first feedback unit is connected to the second node, a control terminal of the second feedback unit is connected to the third node, and the third node is connected to the signal output terminal.

3. The shift register according to claim 2, wherein the first feedback unit comprises a first transistor, whose control terminal is connected to the second node, first terminal is connected to the first level input terminal, and second terminal is connected to the first node; the second feedback unit comprises a second transistor whose control terminal is connected to the third node, first terminal is connected to the first level input terminal, and second terminal is connected to the first node.

4. The shift register according to claim 2, wherein the control module comprises a first control unit and a second control unit, the first control unit has a control terminal connected to a start signal input terminal, an input terminal connected to the first direct current signal input terminal and an output terminal connected to the second node, and the second control unit has a control terminal connected to a reset signal input terminal, an input terminal connected to the second direct current signal input terminal, and an output terminal connected to the second node.

5. The shift register according to claim 4, wherein the first control unit comprises a third transistor, the second control unit comprises a fourth transistor, the third transistor has a control terminal connected to the start signal input terminal, a first terminal connected to the first direct current signal input terminal, and a second terminal connected to the second node, and the fourth transistor has a control terminal connected to the reset signal input terminal, a first terminal connected to the second direct current signal input terminal, and a second terminal connected to the second node.

6. The shift register according to claim 1, wherein the pull-down module comprises a fifth transistor and a first capacitor, the fifth transistor has a control terminal connected to the first node, a first terminal connected to the first level input terminal, and a second terminal connected to the signal output terminal, and two electrode plates of the first capacitor are connected to the first node and the first level input terminal respectively.

7. The shift register according to claim 2, wherein the shift register further comprises a second feedback module, whose control terminal is connected to the first node, input terminal is connected to the first level input terminal, and output terminal is connected to the second node.

8. The shift register according to claim 7, wherein the second feedback module comprises a sixth transistor, whose control terminal is connected to the first node, first terminal is connected to the first level input terminal, and second terminal is connected to the second node.

9. The shift register according to claim 1, wherein the first pull-up module comprises a seventh transistor, an eighth transistor and a ninth transistor, the seventh transistor has a control terminal connected to the first direct current signal input terminal, a first terminal connected to a second clock signal input terminal, and a second terminal connected to a control terminal of the ninth transistor; the eighth transistor has a control terminal connected to the second direct current signal input terminal, a first terminal connected to a fourth clock signal input terminal, and a second terminal connected to the control terminal of the ninth transistor; and the ninth transistor has a first terminal connected to the first node, and a second terminal connected to the second level signal input terminal.

10. The shift register according to claim 2, wherein the shift register further comprises a second pull-up module, and the second pull-up module has an output terminal is connected to the signal output terminal and is configured to control connection of the first clock signal input terminal with the signal output terminal.

11. A gate driving circuit, comprising the shift register according to claim 1, wherein all of shift registers are connected in cascades mutually.

12. A display apparatus, comprising the gate driving circuit according to claim 11.

13. A driving method of a shift register used to drive the shift register according to claim 1, comprising:
controlling different feedback units comprised in the first feedback module through different control points, so as to control a potential of the first node,
controlling the pull-down module through the first node, and
controlling connection of the first level input terminal with the signal output terminal.

14. The driving method of the shift register according to claim 13, wherein the shift register further comprises a control module, the first feedback module comprises two feedback units, which are a first feedback unit and a second feedback unit, and the controlling different feedback units through different control points comprises:
the different control points being a second node and a third node;
controlling the second node through an output terminal of the control module, and controlling the first feedback unit through the second node, so as to control connection of the first level input terminal with the signal output terminal; and
controlling the third node through the signal output terminal, controlling the second feedback unit through the third node, and controlling connection of the first level input terminal with the first node, so as to control the connection of the first level input terminal with the signal output terminal.

15. The gate driving circuit according to claim 11, further comprising a control module, wherein the first feedback module comprises two feedback units, which are a first feedback unit and a second feedback unit, the different control points are a second node and a third node, the control module has an output terminal connected to the second node, and is configured to control a level of the second node, a control terminal of the first feedback unit is connected to the second node, a control terminal of the second feedback unit is connected to the third node, and the third node is connected to the signal output terminal.

16. The gate driving circuit according to claim 15, wherein the first feedback unit comprises a first transistor, whose control terminal is connected to the second node, first terminal is connected to the first level input terminal, and second terminal is connected to the first node; the second feedback unit comprises a second transistor, whose control terminal is connected to the third node, first terminal is connected to the first level input terminal, and second terminal is connected to the first node.

17. The gate driving circuit according to claim 15, wherein the control module comprises a first control unit and a second control unit, the first control unit has a control terminal connected to a start signal input terminal, an input terminal connected to a first direct current signal input terminal and an output terminal connected to the second node, and the second control unit has a control terminal connected to a reset signal input terminal, an input terminal connected to a second direct current signal input terminal, and an output terminal connected to the second node.

18. The shift register according to claim 17, wherein the first control unit comprises a third transistor, the second control unit comprises a fourth transistor, the third transistor has a control terminal connected to the start signal input terminal, a first terminal connected to the first direct current signal input terminal, and a second terminal connected to the second node, and the fourth transistor has a control terminal connected to the reset signal input terminal, a first terminal connected to the second direct current signal input terminal, and a second terminal connected to the second node.

19. The shift register according to claim 10, wherein the second pull-up module comprises a tenth transistor, an eleventh transistor and a second capacitor, the tenth transistor has a control terminal connected to the second level input terminal, a first terminal connected to the second node, and a second terminal connected to a control terminal of the eleventh transistor, the eleventh transistor has a first terminal connected to the first clock signal input terminal, and a second terminal connected to the signal output terminal, and two electrode plates of the second capacitor are connected to the second node and the first level input terminal respectively, and a product of length and width of a channel of the eleventh transistor is at least two times of that of the tenth transistor.

20. A shift register, comprising:
a first feedback module; and
a pull-down module,
wherein:
the first feedback module comprises at least two feedback units,
control terminals of respective feedback units are connected to different control points respectively,
each feedback unit has an input terminal connected to a first level input terminal and an output terminal connected to a first node,
the first node is connected to a control terminal of the pull-down module, and
the pull-down module has an input terminal connected to the first level input terminal and an output terminal connected to a signal output terminal of the shift register,
wherein the shift register further comprises a control module, the first feedback module comprises two feedback units, which are a first feedback unit and a second feedback unit, the different control points are a second node and a third node, the control module has an output terminal connected to the second node and is configured to control a level of the second node, a control terminal of the first feedback unit is connected to the second node, a control terminal of the second feedback unit is connected to the third node, and the third node is connected to the signal output terminal,
wherein the shift register further comprises a second pull-up module, and the second pull-up module has an output terminal is connected to the signal output terminal and is configured to control connection of the first clock signal input terminal with the signal output terminal,
wherein the second pull-up module comprises a tenth transistor, an eleventh transistor and a second capacitor, the tenth transistor has a control terminal connected to the second level input terminal, a first terminal connected to the second node, and a second terminal connected to a control terminal of the eleventh transistor, the eleventh transistor has a first terminal connected to the first clock signal input terminal, and a second terminal connected to the signal output terminal, and two electrode plates of the second capacitor are connected to the second node and the first level input terminal respectively, and a product of length and width of a channel of the eleventh transistor is at least two times of that of the tenth transistor.

* * * * *